United States Patent [19]

Hajdu et al.

[11] 4,298,980

[45] Nov. 3, 1981

[54] LSI CIRCUITRY CONFORMING TO LEVEL SENSITIVE SCAN DESIGN (LSSD) RULES AND METHOD OF TESTING SAME

[75] Inventors: Johann Hajdu; Guenter Knauft, both of, Boeblingen, Fed. Rep. of Germany

[73] Assignee: International Business Machines Corporation, Armonk, N.Y.

[21] Appl. No.: 60,932

[22] Filed: Jul. 26, 1979

[30] Foreign Application Priority Data

Sep. 30, 1978 [DE] Fed. Rep. of Germany ....... 2842750

[51] Int. Cl.³ .................... G01R 31/28; G06F 11/00
[52] U.S. Cl. ................... 371/25; 324/73 R; 364/900; 371/21
[58] Field of Search ... 364/900 MS File, 200 MS File; 371/15, 26, 72, 25, 21; 324/73 R, 73 AT

[56] References Cited

U.S. PATENT DOCUMENTS

| | | | |
|---|---|---|---|
| 3,582,633 | 6/1971 | Webb | 371/25 |
| 3,675,200 | 7/1972 | Bossen et al. | 371/38 |
| 3,761,695 | 9/1973 | Eichelberger | 371/25 |
| 3,783,254 | 1/1974 | Eichelberger | 371/25 |
| 3,784,907 | 1/1974 | Eichelberger | 324/73 AT |
| 3,815,025 | 6/1974 | Jordan | 324/73 R |
| 3,961,254 | 6/1976 | Cavaliere et al. | 324/73 AT |
| 4,006,492 | 2/1977 | Eichelberger et al. | 357/45 |
| 4,051,352 | 9/1977 | Eichelberger et al. | 364/716 |
| 4,051,353 | 9/1977 | Lee | 364/716 |
| 4,063,078 | 12/1977 | Das Gupta et al. | 364/700 |
| 4,063,080 | 12/1977 | Eichelberger et al. | 324/73 AT |
| 4,074,851 | 2/1978 | Eichelberger et al. | 324/73 AT |
| 4,100,605 | 7/1978 | Holman | 364/900 |
| 4,167,041 | 9/1979 | Curlander et al. | 364/900 |
| 4,225,957 | 9/1980 | Doty, Jr. et al. | 471/25 |

OTHER PUBLICATIONS

Balasubramanian, P. S. et al., "Testing LSI Memory Arrays Using on Chip I/O Shift Register Latches" in *IBM Tech. Disc. Bull.*, vol. 17, No. 7, Dec. 1974, pp. 2019-2020.

Ross, B. M. et al., "Combined Test Scanning and Serial-Deserializing Shift Register" in *IBM Tech. Discl. Bull.*, vol. 19, No. 2, Jul. 1976, pp. 480-481.

Dimitri, K. E., "Delay Testing and Diagnosis of LSSD Shift Register Strings" in *IBM Tech. Discl. Bull.*, vol. 20, No. 1, Jun. 1977, pp. 307-312.

Hsu, F. et al., "Selective Control of Off-Subassembly Drivers To Test Logic Systems" in *IBM Tech. Discl. Bull.*, vol. 20, No. 11B, Apr. 1978, pp. 4728-4730.

Williams, Single Clock Shift Register Latch, IBM Technical Disclosure Bulletin, vol. 16, No. 6, Nov. 1973.

Berglund, Level-Sensitive Scan Design Tests, Chips, Boards, Systems, Electronics, Mar. 15, 1979, pp. 108-110.

Correia et al., 14 Design Automation Conference Proceedings, Introduction to AN LSI Test System, Jun. 20-22, 1977, pp. 460-461.

Eichelberger et al., A Logic Design Structure for LSI Testability, 14th Design Automation Conference Proceedings, Jun. 20-22, pp. 462-468, 1977.

Godoy et al., Automatic Checking of Logic Design Structures for Compliance with Testability Ground Rules, 14th Design Conf. pp. 469-478.

Botoroff et al., Test Generation for Large Logic Networks, 14th Design Automation Conference Proceedings, Jun. 20-22, 1977, pp. 479-485.

Hsieh et al., Delay Test Generation, 14th Design Automation Conference Proceedings, Delay Test Generation, pp. 486-491.

Storey et al., Delay Test Simulation, 14th Design Automation Conference Proceedings, Jun. 20-22, 1977, pp. 492-494.

*Primary Examiner*—Charles E. Atkinson
*Attorney, Agent, or Firm*—Wesley DeBruin

[57] ABSTRACT

An LSI integrated semiconductor circuit system comprised of a plurality of interconnected minimum replaceable units. The system and each minimum replaceable unit fully conforms to the Level Sensitive Scan Design (LSSD) Rules. [Level Sensitive Scan Design Rules are fully disclosed and defined in each of the following U.S. Pat. Nos. 3,783,254, 3,761,695, 3,784,907 and in the publication "A Logic Design Structure For LSI Testability" by E. B. Eichelberger and T. W. Williams, 14th Design Automation Conference Proceedings, IEEE Computer Society, June 20-22, 1977, pages 462-467, New Orleans, La.]. Each of the minimum replaceable units includes a shift register segment having more than two shift register stages. Each register stage of each shift register segment of each minimum replaceable unit includes a master flip-flop (latch) and a slave flip-flop (latch). Connection means is provided for connecting the shift register segments of said minimum replaceable units into a single shift register. Additional controllable circuit means including test combinational circuit means is provided for setting a predetermined pattern in only said first two stages of each shift register segment of said minimum replaceable units. The additional circuit means facilitates and is utilized in testing the circuit integrity (stuck faults and continuity) of each minimum replaceable unit.

5 Claims, 6 Drawing Figures

FIG. 6

| SRS | 1. SEGMENT | | | | | | | | 2. SEGMENT | | | | | | | | 3. SEGMENT | | | | | | | |
|---|---|---|---|---|---|---|---|---|---|---|---|---|---|---|---|---|---|---|---|---|---|---|---|---|
| | 1 | 2 | 3 | 4 | 5 | 6 | 7 | 8 | 1 | 2 | 3 | 4 | 5 | 6 | 7 | 8 | 1 | 2 | 3 | 4 | 5 | 6 | 7 | 8 |

SHIFT DIRECTION →

SHIFT REGISTER CHAIN

A WITHOUT STUCK FAULT

| | | | | | | | | | | | | | | | | | | | | | | | | |
|---|---|---|---|---|---|---|---|---|---|---|---|---|---|---|---|---|---|---|---|---|---|---|---|---|
| OPERATION MODE | | | | | | | | | | | | | | | | | | | | | | | | |
| INITIAL CONDITIONS | U | U | U | U | U | U | U | U | U | U | U | U | U | U | U | U | U | U | U | U | U | U | U | U |
| TEST CONDITIONS | U | U | U | U | U | U | U | U | Ū | U | U | U | U | U | U | U | U | U | U | U | U | U | U | U |
| BITS SHIFTED OUT | U | U | U | U | U | U | U | U | Ū | U | U | U | U | U | U | U | U | U | U | U | U | U | U | U |

→ TIME (SHIFT OPERATION)

B WITH STUCK FAULT

| | | | | | | | | | | | | | | | | | | | | | | | | |
|---|---|---|---|---|---|---|---|---|---|---|---|---|---|---|---|---|---|---|---|---|---|---|---|---|
| OPERATION MODE | | | | | | | | | | | | | | | | | | | | | | | | |
| INITIAL CONDITIONS | U | U | U | U | U | U | U | U | U | U | U | U | U | U | U | U | U | U | U | U | U | U | U | U |
| TEST CONDITIONS | U | U | U | U | U | S | S | S | U | U | U | S | S | U | U | U | Ū | U | U | U | U | U | U | U |
| BITS SHIFTED OUT | S | S | S | S | S | S | S | S | S/U | S/U | S/U | S/U | U | U | U | Ū | Ū | U | U | U | U | U | U | U |

→ TIME (SHIFT OPERATION)

LEGEND:
- U  BIT VALUE OR STATUS UNDEFINED 1 OR 0
- Ū  STATUS CHANGED WITH REF. TO SRS 2
- S  STATUS UNCHANGED

LSI CIRCUITRY CONFORMING TO LEVEL SENSITIVE SCAN DESIGN (LSSD) RULES AND METHOD OF TESTING SAME

The invention relates to the testing of monolithically integrated semiconductor circuits and particularly to circuitry conforming to the Level Sensitive Scan Design (LSSD) Rules. [Level Sensitive Scan Design Rules are fully disclosed and defined in U.S. Pat. Nos. 3,783,254, 3,761,695, 3,784,907 and the publication "A Logic Design Structure For LSI Testability" by E. B. Eichelberger and T. W. Williams, 14th Design Automation Conference Proceedings, IEEE Computer Society, June 20-22, 1977, pages 462-467, New Orleans, La.].

The invention may be summarized as monolithically integrated semiconductor circuits composed of several minimum units and methods of testing same. Each minimum replaceable unit includes a shift register segment having more than two shift register stages. The series arrangement of all shift register segments together with clock and shift lines required for that purpose represent a shift register with common shift input and output. Additional circuit means is provided in each minimum replaceable unit for setting predetermined data into at least two successive stages of each shift register segment. Now, as will be more fully apparent from the detailed description hereinafter, by means of applied shift pulses the entire shift register and each segment may be tested by monitoring the shift register output. Also, by knowing the number of stages in each shift register segment, upon detection of an error at the output of the shift register, the defective minimum replaceable unit (and defective shift register stage therein) may be identified.

CROSS-REFERENCE TO RELATED PATENTS AND PUBLICATIONS

U.S. Pat. No. 4,063,080 entitled "Method of Propagation Delay Testing A Level Sensitive Embedded Array Logic System", filed June 30, 1976, granted Dec. 13, 1977 to E. B. Eichelberger, E. I. Muehldorf, R. G. Walther and T. W. Williams, and of common assignee.

U.S. Pat. No. 4,051,352 entitled "Level Sensitive Embedded Array Logic System", filed June 30, 1976, granted Sept. 27, 1977 to E. B. Eichelberger, E. I. Muehldorf, R. G. Walther and T. W. Williams, and of common assignee.

U.S. Pat. No. 4,006,492 entitled, "High Density Semiconductor Chip Organization" filed June 23, 1975, granted Feb. 1, 1977 to E. B. Eichelberger and G. J. Robbins, and of common assignee.

U.S. Pat. No. 4,051,353 entitled "Accordion Shift Register and Its Application In The Implementation of Level Sensitive Logic System", filed June 30, 1976, granted Sept. 27, 1977 to Hua-Tung Lee, and of common assignee.

U.S. Pat. No. 4,063,078 entitled "Clock Generation Network For Level Sensitive Logic System," filed June 30, 1976, granted Dec. 13, 1977 to E. B. Eichelberger and S. DasGupta, and of common assignee.

U.S. Pat. No. 3,783,254 entitled "Level Sensitive Logic System", filed Oct. 16, 1972, granted Jan. 1, 1974 to Edward B. Eichelberger and of common assignee.

U.S. Pat. No. 3,761,695 entitled "Method of Level Sensitive Testing A Functional Logic System" filed Oct. 16, 1972 granted Sept. 25, 1973 to Edward B. Eichelberger and of common assignee.

U.S. Pat. No. 3,784,907 entitled "Method of Propagation Delay Testing A Functional Logic System" filed Oct. 16, 1972 granted Jan. 8, 1974 to Edward B. Eichelberger and of common assignee.

IBM Technical Disclosure Bulletin Publication entitled "Single Clock Shift Register Latch" by T. W. Williams, Vol. 16, No. 6, November 1973, page 1961.

"Level-Sensitive Scan Design Tests, Chips, Boards, System" by Neil C. Berglund (IBM Corp. General Systems Division, Rochester Minn.) Electronics, Mar. 15, 1979, pages 108 to 110. "A Logic Design Structure For LSI Testability" by E. B. Eichelberger and T. W. Williams, 14th Design Automation Conference Proceedings, IEEE Computer Society, June 20-22, 1977, New Orleans, La.

BACKGROUND OF THE INVENTION

The increasingly available, highly integrated circuit arrangements in the form of modules structured of individual semiconductor chips comprise in accordance with the higher degree of integration the equally increasing difficulty of detecting error-containing semiconductor circuits. This applies in particular if the functional units represented by semiconductor circuits comprise combinational circuits and sequential circuits.

One way of detecting minimum replaceable units containing faulty storage elements is for each minimum replaceable unit to have its own specific associated test conductor terminal. Then in an individual test the respective test conductor terminal could be referred to for error display. Such steps are, however, prohibitive since they would not only require an inadmissibly high number of additional terminals requiring a corresponding amount of space which is not easily available for elements of a high degree of integration, but which due to the necessary individual testing would require a considerable amount of time. Furthermore, in a testing of highly integrated semiconductor circuits containing sequential circuits a functional test is very difficult since for that purpose and for a clear error detection the respective storage states have to be known in advance. In other words, prior to the execution of a functional check the storage elements have to be brought into known states, or the states have to be determined.

According to a testing device described in German Offenlegungsschrift No. 23 49 324 [corresponding to U.S. Pat. No. 3,761,695 fully identified supra] this can be achieved by setting a test pattern in the monolithically integrated semiconductor circuits. Of course under the condition that the functional unit to be tested is converted for testing, from a circuit system into a network, i.e. from a sequential circuit into a combinational circuit. Each storage element is a shift register stage containing a master flipflop and a slave flipflop. The flipflops being d.c. latches. All storage elements of a functional unit to be tested can be combined into one single shift register divided into individual segments. The shift register segments being considered minimum replaceable units.

The disclosures of U.S. Pat. Nos. 3,783,254, 3,761,695 and 3,784,907 (each fully identified supra) are incorporated herein by reference thereto to the same extent as though the specification and drawings of said patents were expressly set-forth herein. The first test is for the shift register function in order to find out whether the shift register operates correctly. If no error is found there follows the test for level sensitivity (level sensitive control). For that purpose, all shift register levels are set into a specific known state in order to eliminate all influences of the storage history. For a thorough examination, however, several hundreds of test patterns, i.e., state combinations of the shift register stages have to be used so that, as pointed out above, a considerable number of process steps is required. A correspondingly complex and complicated process has to be applied for detecting a specific segment, i.e., a minimum replaceable unit containing the cause of an error. However, the precise detection of and consequently the possibility to exchange a faulty segment will have to be achieved, since this will considerably facilitate operation and maintenance of a complex system. In order to arrive at that aim in the least complicated manner additional circuit component terminals and line metallizations are required which in a highly integrated monolithic semiconductor circuit would require considerable supplementary means. These include in particular, pins and the space they require on a module or chip, if it is considered additionally that the main effort in highly integrated semiconductor circuit technology is to keep the ratio between number of pins and number of circuits as low as possible. As pointed out above, however, this is not possible if there is to be an error detection down to a minimum replaceable unit by means of the known steps.

SUMMARY OF THE INVENTION

It is the object of the invention to provide a testing process improved by simplification, and an advantageous arrangement for that purpose, with monolithically integrated semiconductor circuits each consisting of several minimum replaceable units having to be exposed to a test to identify faulty minimum replaceable units without requiring a great amount of additional means in the form of conductive lines, pins, circuit components, etc.

According to the invention, this is accomplished by additional circuitry on the minimum replaceable units and the method of testing as set-forth in summary below. Alternatively, the invention may be succinctly summarized as LSI circuitry conforming to the Level Sensitive Scan Design (LSSD) Rules and method of testing same.

A method of testing monolithically integrated semiconductor circuits composed of several minimum replaceable units where all storage elements contained therein together with combinational circuits can be assembled into segments each consisting of one shift "register" having more than two shift register stages. The series arrangement of all segments together with clock and shift lines required for that purpose representing a single large shift register with common shift input and output. The invention includes provision of additional circuitry for providing set data patterns (1 or 0) in at least certain stages of each shift register segment of said single large shift register. Exercising the shift controls and monitoring the single large shift register output to determine which minimum replaceable unit (or units) include defective shift register segments.

In preparing the stuck fault test of a semiconductor circuit assembled into a shift register for testing purposes, the first two respective shift register stages of each minimum replaceable unit, i.e., of a segment, are set into switching states (1 or 0) opposite to each other. This measure is superfluous for the two first shift register stages of the first segment. This permits by means of simple counting during the stuck fault test, while monitoring shift output, the identification of a faulty segment. The appearance of bit equality for bit values of the respective first two shift register stages correspondingly, there should appear, at the proper time, complementary bit pairs at the shift output which correspond to the respectively opposite switching states of the first two shift register stages in each minimum replaceable unit.

If in any of the shift register segments there is a stuck fault there is no change of switching state at the respective location, so that during the shift-out upon the arrival of one of the above mentioned complementary bit pairs there is not effect whatever, and consequently at the shift output of this location of the bit sequence there is no bit value change, either. Simple counting of the output bits will be sufficient for identifying the faulty segment.

For error detection the invention thus consists in examining the bit sequence at the shift output to find out whether the respective bit values for the first two shift register stages of the segments in the monolithically integrated semiconductor circuit to be tested are equal or unequal to each other so that the necessary steps can be taken for eliminating the errors caused thereby. If a faulty segment has been detected, and after its replacement by a new segment, the segment chain is exposed to a second continuity test for detecting any further stuck faults possibly contained therein which due to the previously detected bit equality could not appear. The process is continued until all faulty segments are sure to have been found.

For being able to execute the invention the only elements required are an additional pin and a test combinational circuit at the input of each minimum replaceable element, i.e., of a segment which compared with the otherwise necessary steps for error detection down to a segment permits a considerable reduction of process steps. It should be kept in mind, however, that the storage elements of a functional unit to be tested are merely assembled for testing the operation as a shift register; normally, the storage elements are to be used or operated for their specific purpose.

The additional amount of process steps and time normally required for such a test which, as pointed out above, is quite considerable is very much reduced by the invention. This is of advantage particularly in those cases where the segments and functional units are in the system of a large packing hierarchy where additional pins and line metallizations would multiply accordingly so that serious problems could arise. Since owing to the invention only one single additional pin per segment is required no serious difficulties are expected even for maximum packing hierarchy.

Although the storage elements assembled into a shift register for carrying out the invention can be designed as respective functional units with main storage and intermediate storage element in any known structure, it has turned out to be advantageous if the storage elements in a minimum replaceable unit to be tested are used as a master flipflop, with a respective slave flipflop being added. Furthermore, it is not essential for the invention per se whether the two respective first shift register stages of a minimum replaceable unit are set into the respective opposite switching state via parallel or series input. In accordance with an advantageous development of the invention, however, the series input for switching the first two shift register stages of a respective segment are considered advantageous in accordance with the invention.

The master and slave-clock pulses required for switching the master and slave flipflops do not necessarily have to be applied from outside via separate lines, but can advantageously also be derived from the respective test circuit forming pulses applied for switching the two first shift register levels of each segment, provided a respective sequential circuit is associated to the respective test combinational circuit. As the necessary steps are known per se it suffices to point out that a respective flipflop chain can be provided for being released by the test circuit forming pulses.

Finally, two different methods are selected in accordance with the invention from the possible number of ways of the serial input of test circuit forming pulses for converting the first two shift register levels of each segment to carry out the invention in a particularly advantageous manner. According to the first preferred embodiment, the test combinational circuit at the input of each segment is designed for scanning the switching state of the respective first shift register level before the application of the test circuit forming pulse so that upon the applying of a test circuit forming pulse as well as of the master and slave-clock pulses the bit value corresponding to the switching state of the first shift register stage is transferred to the second shift register stage, and the complementary bit value is read into the first shift register stage. In the second preferred embodiment, irrespective of the history of the respective first two shift register stages, a predetermined bit value is applied to the first shift register stage through correspondingly applying a test circuit forming pulse in coincidence with a master-clock pulse. This bit value entered into the first shift register stage is transferred, upon the appearance of the second master-clock pulse, into the second shift register stage, a complementary bit value being simultaneously applied to the first shift register stage.

The foregoing and other objects, features and advantages of the invention will be apparent from the following more particular description and preferred embodiments of the invention as illustrated in the accompanying drawings.

Further advantageous embodiments and developments of the invention are set-forth hereinafter.

Below, the invention will be described on the basis of an embodiment, with reference to the drawings given below.

BRIEF DESCRIPTION OF THE DRAWINGS

FIG. 6 illustrates a diagram with specifications for explaining the error detection process in accordance with the invention.

DETAILED DESCRIPTION OF THE INVENTION

Figure 1:
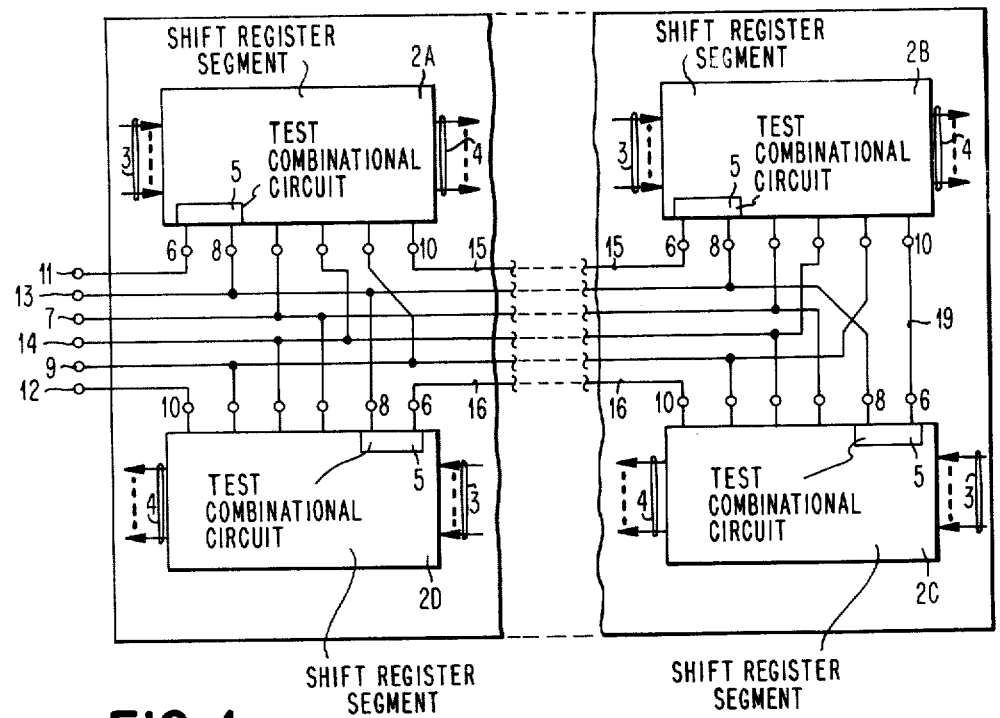
FIG. 1 illustrates a functional unit in the form of a hierarchical system with shift register segments equipped in accordance with the invention, and with the necessary addressing and operating lines.

In the hierarchical system of FIG. 1 the minimum replaceable units are provided on a circuit card, a module, etc. in the form of shift register segments 2A, 2B, 2C, 2D which can be provided in a large number, as indicated by the interrupted lines. It is not absolutely necessary to provide only two shift register segment lines one above the other; a matrix-like arrangement of the shift register segments is possible in that the individual rows and columns can each contain a larger number of shift register segments. Furthermore, the shift register segments do not have to be provided in a regular arrangement on the respective substrates. The segments themselves can be provided in the form of semiconductor chips, modules, circuit cards, etc.; however, minimum replaceable units have to be represented in any case in a large hierarchical system. The substrates carrying such shift register segments represent the respective higher unit in the hierarchical system.

On the substrate in FIG. 1 carrying shift register segments 2A, 2B, 2C and 2D conductors 11 are provided as shift input line, 13 as test pulse line, 7 as slave-clock pulse line, 14 as system-clock pulse line, 9 as master shift clock line, 12 as shift output line, and 15, 16 and 19 as shift connecting lines. All are utilized for carrying out the functional test in accordance with the invention. Each shift register segment 2A, 2B, 2C, 2D also contains the bus 3 provided for addressing the storage elements in the individual shift register segments, and storage element output bus 4. Via these conductors, for the respective use of the functional unit, the individual storage elements are to be brought into the respective state so as to be able to supply output data for further use. A more detailed specification is not required as it is without importance for the invention.

The above mentioned conductors are schematically shown in FIG. 1, their respective course being without importance for the invention, i.e., whether the connections are provided on the left, on the right, over or under the substrate. This depends in each case on the substrate layout (design), and on the planned position of shift register segments 2A, 2B, 2C and 2D. Each one of shift register segments 2A, 2B, 2C and 2D contains a block 5 for indicating the test combinational circuit which with its terminal 6 is applied to the respective shift line 11 or shift connecting line 15, 16, 19, and with its terminal 8 to test circuit forming pulse line 13. The respective output terminal 10 of shift register segments 2A, 2B, 2C and 2D is also applied correspondingly to the above shift connecting lines 15, 16, 19, or to shift output line 12.

Under the influence of test combinational circuit 5 during the transfer of a test circuit forming pulse, forming pulses can be applied in accordance with the invention via test circuit forming pulse line 13 for the respective first two shift register stages of the series-arranged shift register segments 2A, 2B, 2C and 2D so that the respective first two shift register stages can be brought into opposite switching states. In a subsequent shift operation shift register segments 2A, 2B, 2C and 2D series-arranged into one single shift register via links 15, 19 and 16 in the absence of an error, transfer a bit sequence which indicates at shift output line 12 the respective level changes in the first two shift register stages of all shift register segments. However, if there appears no such bit value change in the bit sequence at the shift output from a predetermined number of bits onward this is a clear indication of a faulty shift register segment so that with a known number of storage elements in the various shift register segments 2A, 2B, 2C and 2D the faulty shift register segment is to be determined by simply counting the bits up to the skip in the bit sequence; the faulty segment can then be repaired or replaced.

The bit sequence test at the shift output is in actuality an examination. After a predetermined number of bits in the bit sequence, fixed by the respective number of shift register stages in the individual shift register segments, the equality or non-equality of bit values is used as the determining factor. If bit equality is found there is a stuck fault which, as pointed out above, initiates the respective steps. Such a check for bit value equality can be performed by means of a correspondingly counter-controlled comparator, where the comparing signal can be used for error display.

If a faulty segment has thus been found in a sequence of shift register segments it remains to be seen whether any of the following segments of the respective sequence of shift register segments contains a continuity error since owing to the bit value equality caused already by the detected error such as stuck fault is covered in the bit sequence at the shift register output. After the detection of a faulty segment, and the replacement thereof, the sequence of shift register segments which follow the replaced faulty segment are tested. Namely, the faulty segment has been replaced by a functionally good segment and the entire sequence of shift register segments is once more tested. This process is repeated until it is sure that the respective sequence of shift register segments has been completely tested in the continuity test.

The storage elements in the individual shift register segments 2A, 2B, 2C and 2D can be of any conventional design, but each storage element has to have at least one additional intermediate storage element so that a shift register can be assembled for a series connection, e.g., via OR-elements. The series arrangement of the thus formed shift register stages is therefore effected via switching elements which are controllable in such a manner that only for testing purposed can there be a series arrangement of the storage elements contained in the minimum replaceable unit, so that for the intended use of the storage elements their undisturbed and independent operation is ensured. Apart therefrom, the individual storage elements of a minimum replaceable unit to be tested can exist in an even greater circuit system, i.e., combinational circuits together with sequential circuits, i.e., circuit elements additionally required for the planned use can exist in the minimum replaceable units which, as pointed out above, are provided here as shift register segments. However, as they are of no importance for explaining the invention the block diagram of FIG. 2 only shows a pure storage element operation circuit, or a sequential circuit respectively to get a distinct and clear representation for specifying the invention. Although the invention can be operated with any kind of shift register stage design the master-slave flipflop configuration realized by means of latches 40 and 50 shown in FIG. 2 will now be described in detail. Latch 40 serving as master flipflop consists of the four NAND-elements 24, 25, 26 and 27, the first three, i.e., 24, 25 and 26 addressing the last-mentioned NAND-element 27 from whose output to an input of the NAND-element 26 a holding line is provided as a feedback path 45 so that the state adopted by master flipflop 40 is latched. In detail, the three inputs of NAND-element 26 receive via line 81 an inverted master-clock pulse, via line 85 an inverted system-clock pulse, and as mentioned above via feedback path 45 the output pulse of the series-arranged NAND-element 27. A second input of NAND-element 27 is applied to the output of NAND-element 25 whose inputs are provided via lines 3 for data processing operation in that via line 84 also the system-clock pulse is applied. The third input of NAND-element 27 is applied to the output of the third NAND-element 24 whose inputs receive via line 80 the master-clock pulse and via another line the shift pulse.

To the output of NAND-element 27 and thus to feedback path 45 the control input of slave flipflop 50 is connected which itself is comprised of the three NAND-elements 28, 29 and 30. In detail, the output of NAND-element 28 is connected to an input of NAND-element 30 whose second input is applied to the output of NAND-element 29. The output of NAND-element 30 is connected via line 48 to an input of NAND-element 29 whose second input receives via line 83 an inverted slave-clock pulse. Via line 82, NAND-element 28 receives at its second input the slave-clock pulse, the other input of the NAND-element 28 being connected to the output of NAND-element 27 of master flipflop 40.

Figure 2:
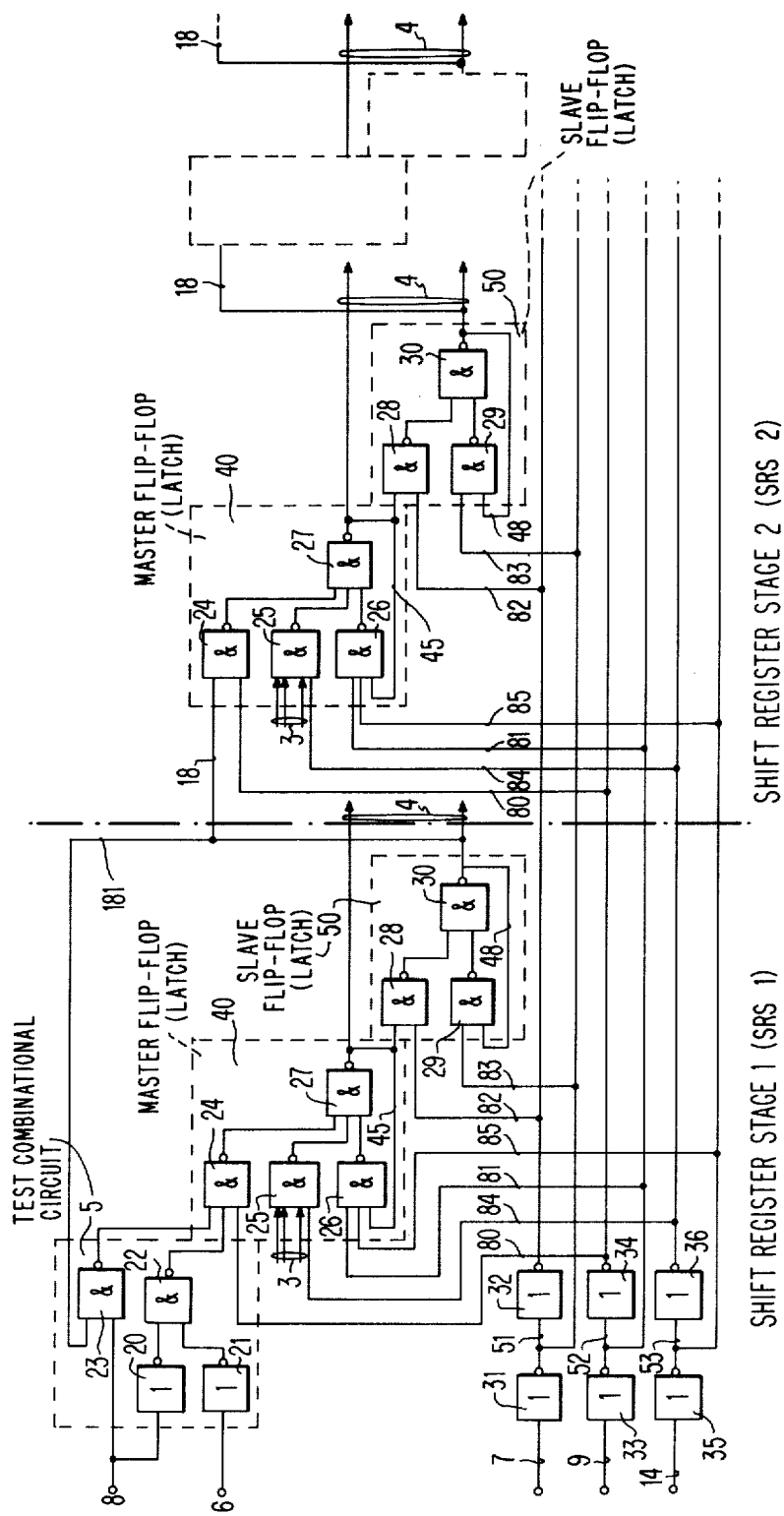
FIG. 2 illustrates a block diagram of a shift register segment with test combinational circuitry for carrying out the first operation in accordance with the invention.

Although not actually required and probably not usual, either it is assumed for simplifying the specification of the invention that the shift register stages in the shift register segments are all of exactly the same structure. The output line group 4 of a respective shift register stage is composed of lines which, as shown in FIG. 2, are each connected to the output of flipflops 40 and 50 and if necessary, not shown here, to additional OR-elements whose inputs can be connected to a great variety of points in the master and slave flipflops 40 and 50.

The master-clock pulses are applied via line 9, the slave-clock pulses via line 7, and the system-clock pulses via line 14, each clock pulse line having provided therein two respective series-arranged inverters 33, 34; 31, 32; 35, 36 whose respective connecting lines 51, 52 or 53 are connected to additional clock-pulse lines for supplying inverted master-clock pulses, slave-clock pulses and system-clock pulses. Thus, slave-clock pulse line 7 contains inverter 31 which via connecting line 51 is connected to inverter 32 whose output is connected to line 82, whereas connecting line 51 is connected to line 83. Master-clock pulse line 9 is applied to the input of inverter 33 which via connecting line 52 is connected to inverter 34 whose output in turn, is connected to line 80. Connecting line 52 itself is applied to supply line 81. System-clock pulse line 14 is applied to the input of inverter 35 whose output is applied via connecting line 53 to the input of inverter 36.

While the output of inverter 35 is connected to supply line 85 the output of inverter 36 is applied to line 84. The clock pulse inputs of the other shift register stages of a shift register segment are applied via their respectively associated lines 80 to 85 in a corresponding manner to the outputs of inverter 31 to 36.

The output of NAND-element 30 in slave flipflop 50 of a shift register stage is applied via line 18 to the respective control input of the next shift register stage, i.e., at the respective input of NAND-element 24 in the respective master flipflop 40. The last shift register stage of a shift register segment thus shows a shift output which is connected to output line 18 of the last shift register stage therein.

The operation of a thus designed shift register is performed in such a manner that upon the appearance of a shift pulse at the input of a shift register stage the bit value of the shift pulse is entered into the master flipflop under the simultaneous effect of a master clock pulse. With the subsequent slave-clock pulse of reversed polarity the bit value is transferred to that slave flipflop whose output serves in combination with a second master-clock pulse as an input quantity for the following shift register stage. The master-clock pulses and slave-clock pulses substantially consist of pulse sequences whose phases are shifted by 180° with respect to each other. Such an operation for shift registers is known per se and does therefore, not have to be specified in ditail.

For carrying out the first mode of operation for the test executed in accordance with the invention, i.e., for setting the switching state of the first shift register stage SRS1 as a function of the bit value transferred to the second shift register stage SRS2, i.e., with the latter's complementary value, a feedback path 181 is provided from the output of the slave flipflop 50 or its output line 18, respectively, in the first shift register stage SRS1 to an input of test combinational circuit 5. Test combinational circuit 5 has a further input with contact 6 for receiving the shift pulses, and another input via contact 8 for supplying the test circuit forming pulses. The outputs of test combinational circuit 5 are applied to the inputs of NAND-element 24 in master flipflop 40 of the first shift register stage SRS1. Test combinational circuit 5 contains two NAND-elements 22 and 23. NAND-element 23 is applied with its input to feedback path 181 while the second input is connected to terminal 8. NAND-element 22 is fed at its two inputs via one respective inverter 20, 21, the one being connected to terminal 8 for supplying the test circuit forming pulses, and the other to terminal 6 for supplying the shift pulses.

Figure 4:
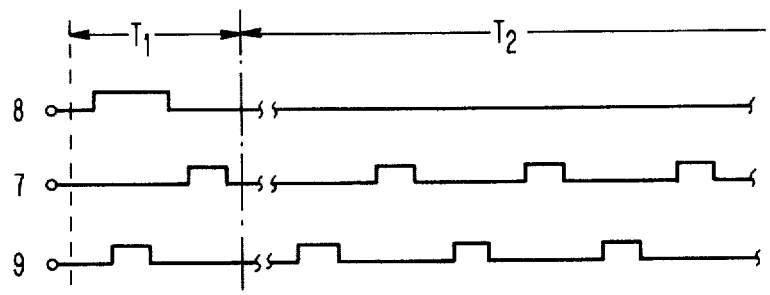
FIG. 4 shows pulse diagrams for explaining the first operation in accordance with the invention.

With the assistance of the pulse diagrams according to FIG. 4 the change of stages according to the invention of the two first shift register stages SRS1 and SRS2 of a respective shift register segment with the application of a test circuit forming pulse via contact terminal 8 can now be explained. During time T1 substantially extending over one single period of the master-clock pulse, which means that it does not cover two master-clock pulses, a test circuit forming pulse is applied via terminal 8 simultaneously with a master-clock pulse, to master-clock pulse line 9. The duration of the test circuit forming pulse can extend over the entire period T1; i.e., it is longer than that of the master-clock pulse on master-clock pulse line 9 in that the test circuit forming pulse starts earlier and decays later. The system-clock input via line 14 does not receive a signal.

If at first it is assumed that the input of NAND-element 30 in slave flipflop 50 is negative an input via line 181 of NAND-element 23 in test combinational circuit 5 is negative, too, so that irrespective of the application of a test circuit forming pulse at contact 8 the output of NAND-element 23 is always positive. However, if a test circuit forming pulse is applied there is a negative pulse at the input of NAND-element 22 so that the output of NAND-element 22 is positive, too, and that therefore simultaneously with a master-clock pulse on master-clock pulse line 9 all inputs of NAND-element 24 in master flipflop 40 are positive whose output becomes negative in responding thereto.

With a negative input at NAND-element 27 the latter's output is positive so that upon the application of a slave-clock pulse via slave-clock pulse line 7 and subsequently via line 82 to NAND-element 28 whose two inputs are positive, its output becomes negative too. Thus, there is a negative input at NAND-element 30 of slave flipflop 50 so that its output becomes negative. The test circuit forming pulse entered via contact 8 into the test combinational circuit 5, is subsequently transferred under the influence of the master-clock pulse on master-clock pulse line 9 into master flipflop 40 of the first shift register stage SRS1. Since the level originally appearing on output line 18 of slave flipflop 50 of the first shift register stage SRS1 had been assumed as being negative, it is quite obvious that the stages of both shift register stages SRS1, SRS2 are opposite with respect to each other. This occurs since under the influence of the slave-clock pulse on slave-clock pulse line 7 the state of master flipflop 40 in the second shift register stage SRS2 has simultaneously been transferred to the slave flipflop 50 of the second shift register stage SRS2. Thus, the respective shift register segment is prepared for carrying out the actual continuity test.

If contrary to the above conditions it is now assumed that the output of NAND-element 30 in slave flipflop 50 is positive there is a positive level via feedback path 181 at an input of NAND-element 23 in test combinational circuit 5, so that upon the application of a test circuit forming pulse via contact 8 to the one input of NAND-element 24 in master flipflop 40 of the first shift register stage SRS1, there is a negative level at the input. Consequently, there appears a positive potential for the duration of the test circuit forming pulse at terminal 8 at the output of NAND-element 24 so that, if it is assumed that no system-clock pulse has been applied, which during the testing process as such is the case at any rate since there is no system operation, either, the input of NAND-element 25 is positive too. The output of NAND-element 28 is equally positive since, as pointed out above, firstly no system-clock pulse is applied and secondly, in accordance with the invention, the master-clock pulse is applied at master-clock pulse line 9, said master-clock pulse being provided via inverter 33, connecting line 52 and supply line 81 as a negative input at NAND-element 26. Thus, however, the output of NAND-element 27 and at the same time the output of master flipflop 40 are negative so that the output of NAND-element 28 at the input of slave element 50 is positive too.

Since, as indicated in the diagram of FIG. 4, the slave-clock pulse is applied via slave-clock pulse line 7 at a later time only an input of NAND-element 29 receives a positive potential via line 83 under the influence of inverter 31. As the other input of NAND-element 20 in slave flipflop 50 is already positive due to the output of NAND-element 30 this latter element can become effective so that its output now reaches the negative state. As before, the originally existing positive switching state in slave flipflop 50, i.e., a positive potential level, has been transferred simultaneously with the input of the test circuit forming pulse under the influence of the master-clock pulse on master-clock pulse line 9, into master flipflop 40 of the first shift register stage SRS1, to master flip-flop 40 of the second shift register stage SRS2 so that this again produces opposite switching states in the first two shift register stages SRS1 and SRS2 of the respective shift register segment.

This shows that by applying a test circuit forming pulse via terminal 8 to the respective test combinational circuit irrespective of the stage of the first pair of shift register stages of a shift register segment, a respectively opposite switching state can be provided. Due to the invention it is therefore advantageously possible without requiring additional process steps to use a simple testing process for detecting faulty segments in a highly integrated hierarchical structure. Only one single further terminal, i.e., for supplying the test circuit forming pulses is required for this purpose.

Figure 3:
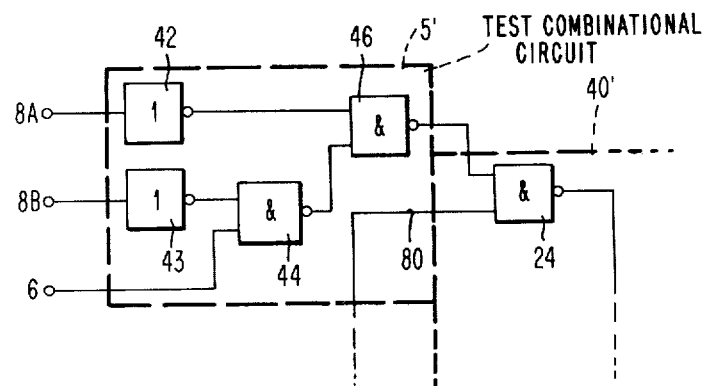
FIG. 3 shows a modified test combinational circuit for carrying out the second operation in accordance with the invention.
Figure 5:
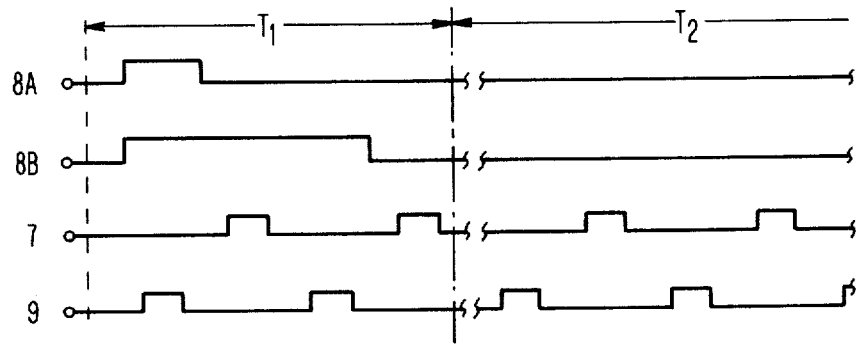
FIG. 5 shows pulse diagrams for explaining the second operation in accordance with the invention.

As pointed out above already the invention is also based on a second preferred mode of test circuit forming operation. For that purpose, the test combinational circuit of FIG. 3 is used whose operation will be explained by means of the pulse diagrams in accordance with FIG. 5. Since in this operation the first two shift register stages SRS1 and SRS2 of a respective shift register segment are executed without considering the respective switcing state, i.e., without considering the respective history, supply line 181 from the output of NAND-element 30 in slave flipflop 50 (FIG. 2) is not included here. Instead, two separately starting test circuit forming pulses are applied individually via contacts 8A and 8B which, however, cover different periods, in such a manner that the test circuit forming pulses and contact 8A is applied, as above, simultaneously with the master-clock pulse on master-clock pulse line 9, and that it can overlap it in its pulse duration both upon starting and upon decaying. As above, it should be made sure that this first test circuit forming pulse does not cover two master-clock pulses, and that the test circuit forming pulse at contact 8B overlaps two successive master-clock pulses on master-clock pulse line 9 without any further master-clock pulses being covered thereby. In the present case, for simplifying the specification of the invention, two separate terminals 8A and 8B are provided. However, it is also possible to provide advantageously only one single terminal for applying one single test circuit forming pulse, the respective extended pulse being derived from the shorter test circuit forming pulse via a monostable circuit which is equally connected to the terminal for supplying the single test circuit forming pulse, so that there is on the one hand the originally applied shorter test circuit forming pulse, and on the other the extended test circuit forming pulse derived from the monostable circuit.

Test combinational circuit 5' modified with respect to the above specification has only one output which is connected to a respectively modified master flip-flop 40' of the first shift register stage SRS1 of a shift register segment, i.e., again at the respective input of its NAND-element 24 which in that case has only two inputs, i.e., a further one serving via supply line 80 to apply the master-clock pulses to master-clock pulse line 9. Test combinational circuit 5' contains two NAND-elements 44, 46 and two inverters 42, 43. Contrary to the above specifications, however, output NAND-element 46 of test combinational circuit 5' is connected with its input to the output of the one inverter 42 whose input in turn, is connected to terminal 8A for supplying the short test circuit forming pulse. The other input of output NAND-element 46 is applied at the output of the second NAND-element 44 whose first input is at the output of inverter 43 and whose other input is connected to terminal 6 for applying a shift pulse. The input of the second inverter 43 is connected to terminal 8B for supplying the extended test circuit forming pulse. While in the first-described operation according to the invention, under the influence of feedback path 181 for switching both first shift register stages of a shift register segment, the already existing states are involved so that it is made sure that with an applied test circuit forming pulse a respectively opposite switching state is caused in both shift register stages SRS1 and SRS2, the history in the second mode of operation preferred in accordance with the invention is negligible so that the state scanning of shift register stages is excluded.

If for preparing the test a test circuit forming pulse is supplied to terminal 8A the input of NAND-element 46 is negative under the ifluence of inverter 42. Thus, a positive output is caused at NAND-element 46 so that also the input of NAND-element 24 in master flip-flop 40' of the first shift register stage SRS1 becomes positive, if it is not positive already, for providing a negative output with the simultaneous appearance of a master-clock pulse on master-clock line 9, as shown in the pulse diagram of FIG. 5. If the test circuit forming pulse at terminal 8A has decayed so that only the extended test circuit forming pulse is applied at terminal 8B, the respective input of NAND-element 44 is negative so that its output becomes positive too. Since at that time no test circuit forming pulse is active at terminal 8A any longer the other input of output NAND-element 46 in test combinational circuit 5' is positive too, so that the output of NAND-element 46 is negative and thus owing to the negative input a positive output is formed at NAND-element 24 in master flip-flop 40' of the first shift register stage SRS1. At the same time, an inverted master-clock pulse is provided via supply line 81 to NAND-element 26 in master flip-flop 40' of the first shift register stage SRS1. Thus all inputs of NAND-element 27 in master flipflop 40' are positive. Owing to the missing system-clock pulse via line 84 the output of NAND-element 25 is also positive. Thus the switching state of the shift register SRS1 has been changed.

Here too, the state of master flipflop 40' is transferred before the second master-clock pulse to slave flipflop 50 by the slave-clock pulse so that when the second master-clock pulse is applied to master-clock pulse line 9, simultaneously with the input of the altered bit value into shift register stage SRS1, the bit value that had originally existed there is transferred into second shift register stage SRS2 so that here too, after completed test circuit forming, the two first shift register stages of a shift register segment are in a switching state opposite with respect to each other.

If for any reason it should be advantageous in the test circuit forming process according to the invention not to apply clock pulses from the outside these can be derived from the applied test combinational circuit pulses themselves, with test combinational circuit 5 or 5' being extended correspondingly. For that purpose, flip-flop chains can be used in a known manner with corresponding outputs, or with free-running pulse generators with controllable setting-in of pulses. A detailed specification thereof is not necessary since corresponding circuits can be considered known.

On the basis of the above specifications the testing process according to the invention, of a digital functional unit can be explained by means of the diagram of FIG. 6. There, the shift register chain is schematically represented in the upper part of the drawing, as obtained with the individual segments in series arrangement, the individual shift register stages being given numerically in these segments. Under this representation, the operation is shown schematically with and without continuity checks. In the initial states of the shift register stages the bit values are first undefined since it is considered not known which of the stages will adopt state L over stage O. The situation is changed if after the forming of the test states in the first two shift register stages SRS1 and SRS2 of each segment there is a respectively opposite state there.

For the first segment no change of state is given. Obviously, such a change of state would not contribute to the test since this change is the last to be shifted of the entire shift register, and as the operation characteristics of the first shift register segment in the segment sequence is controlled by the change of state of the first two shift register stages SRS1 and SRS2 of the second segment during shift-out. If therefore, a test combinational circuit 5 in the first shift register segment cannot usefully contribute in any way to the execution of the testing process it might be advantageous for various other reasons to provide such a test combinational circuit, if only for the sake of simplification in the design of the segments.

Below the test states the table according to FIG. 6 gives the shift-out bits which, when no stuck fault in the shift register to be tested is assumed, present all segments in the shift-out pulse sequence through the changes of switching state of the first two shift register stages SRS1 and SRS2. In part B of the table according to FIG. 6 a stuck fault marked S is assumed in the fourth shift register stage SRS4 in the second shift register segment. While in this case the change of switching state in the third segment is still detected at the shift-out of the shift register chain, there appears for the second segment from the fourth shift register stage SRS4 onward a stuck fault which at first is not fully detectable and clearly appears as an error only if the next change of switching state, i.e., in the first two shift register stages SRS1 and SRS2 of the second segment, acts on the shift-out bits of the first shift register segment. Due to the fact that the binary state of the shift register output remains a "1" or "0" it can be reliably stated that the following shift register segment, i.e., the second segment, contains a stuck fault.

It can be concluded that owing to the invention, by simply counting the bits a faulty shift register segment can be isolated in that quite simply the equality or inequality of the bit values of the respecive two first shift register stages SRS1 and SRS2 of all shift register segments are controlled in the bit sequence at the shift output. By means of comparators provided at series-arranged counters the respective indicator output signals can be derived so that an error control can easily be automated.

While we have illustrated and described the preferred embodiments of our invention, it is to be understood that we do not limit ourselves to the precise constructions herein disclosed and the right is reserved to all changes and modifications coming within the scope of the invention as defined in the appended claims.

Having thus described our invention, what we claim as new, and desire to secure by Letters Patent is:

1. A method of testing an electronic system comprised of a plurality of interconnected minimum replaceable units, each of said minimum replaceable units includes a multi stage shift register having an input, an output, and shift contorls, and a test combinational circuit connected to said multi-stage shift register wherein each stage of each said shift register includes a master and a slave latch:

said method including the following steps:
 (a) connecting said stages of each said multi-stage shift register of each said minimum replaceable unit to form a single large shift register having a input, an output, and shift controls;
 (b) upon occurrence of a test pulse, utilizing said test combinational circuit of each said minimum replaceable unit to set a predetermined binary bit pattern in only a portion of each multi-stage shift register of each minimum replaceable unit;
 (c) upon occurrence of a shift pulse utilizing said shift controls of said single large shift register to shift out the bit content of said single large shift register; and
 (d) examining the shifted-out bit content of said single large shift register at the output of said single large shift register to determine whether or not said shifted-out bit content faithfully provides said predetermined bit pattern previously set in only a portion of each said multi-stage shift register of each minimum replaceable unit,
whereby from examination of said shifted out bit pattern a minimum replaceable unit having a defective multi-stage shift register may be identified.

2. In a method of testing an electronic system as recited in claim 1 wherein each multistage shift register of each said minimum replaceable unit has more than two states and step (b) is as follows:
 (b) upon occurrence of a test pulse, utilizing said test combinational circuit of each said minimum replaceable unit to set a complementary binary bit pattern in only the first two stages of each multi-stage shift register of each said minimum replaceable unit.

3. A readily testable electronic system for providing a useful function, said electronic system comprising:
 a plurality of minimum replaceable units, each of said unit including a shift register segment having at least first, second and third stages, each of said shift register segments having an input, an output and shift control means;
 connection means connecting the at least first, second and third stages of each shift register segment of each said minimum replaceable unit to form a single large shift register having an input, output and shift control means;
 additional controllable means, said additional controllable means being connected to said plurality of minimum replaceable units and including a test combinational circuit for each shift register segment of each minimum replaceable unit, each said test combinational circuit being connected to the shift register segment of the minimum replaceable unit with which it is associated and setting a predetermined bit pattern in only said first two stages of the shift register segment to which it is connected for test purposes; and
 pulse source means connected to said additional controllable means and said shift control means of said single large shift register for causing the content of said single large shift register to be shifted out, whereby monitoring the output of said single large shift register a malfunctioning minimum replaceable unit may be identified.

4. In a readily testable electronic system for performing a useful function, said readily testable electronic system comprising:
- at least first, second, third and fourth minimum replaceable units (2A, 2B, 2C, 2D, FIG. 1), each said minimum replaceable unit including a multi-stage shift register segment having at least first, second and third stages, and each of said minimum replaceable units also including a test combinational circuit connected only to said first and second stages of the shift register segment of its minimum replaceable unit;
- each of said test combinational circuits (5, FIG. 2) of each said minimum replaceable unit comprising, a first INVERTER circuit (20, FIG. 2) having an input connected to a source of test pulses (8, FIG. 2) and an output, a second INVERTER circuit (21, FIG. 2) having an input connected to a source of shift pulses (6, FIG. 2) and an output, a first NAND circuit (23, FIG. 2) having a first input connected to said source of test pulses, a second input and an output, and a second NAND circuit (22, FIG. 2) having a first input connected to said output of said first INVERTER circuit, a second input connected to said output of said second INVERTER circuit and an output;
- each said stage of each said shift register segments of each said minimum replaceable unit including a Master Latch (40, FIG. 2) and a Slave Latch (30, FIG. 2);
- each Master Latch of each of said first shift register stage of each of said shift register segments comprising, a third NAND circuit (24, FIG. 2) having a first input connected to said output of said first NAND circuit of said test combinational circuit, a second input connected to said output of said second NAND circuit of said test combinational circuit, a third input connected to a source of master clock pulses (80, FIG. 2), and an output, a fourth NAND circuit (25, FIG. 2) having at least a first input connected to a source of data inputs (3, FIG. 2) and an additional input connected to a source of system clock pulses (84, FIG. 2), and an output, a fifth NAND circuit (26, FIG. 2) having a first input connected to a source of inverted master clock pulses (81, FIG. 2), a second input connected to a source of inverted system clock pulses (85, FIG. 2), a third input and an output, and a sixth NAND circuit (27, FIG. 2) having a first input connected to said output of said third NAND circuit, a second input connected to a said output of said fourth NAND circuit, a third input connected to said output of said fifth NAND circuit and an output connected to said third input of said fifth NAND circuit, said output of said sixth NAND circuit also providing the output of said Master Latch (45, 4, FIG. 2);
- each slave latch of each of said first shift register stage of each of said shift register segments comprising, a seventh NAND circuit (28, FIG. 2) having a first input connected to the output (of said sixth NAND circuits) of its associated Master Latch, a second input connected to a source of slave clock pulses (82, FIG. 2) and an output, an eighth NAND circuit (29, FIG. 2) having a first input connected to a source of inverted slave clock pulses (83, FIG. 2), a second input and an output, and a ninth NAND circuit (30, FIG. 2) having a first input connected to said output of said seventh NAND circuit, a second input connected to said output of said eighth NAND circuit and an output connected to said second input of said eighth NAND circuit, said output of said ninth NAND circuit also providing the output (48, 4 FIG. 2) of said Slave Latch, said output of said slave latch is connected (181, FIG. 2) to said first input of said first NAND circuit of said test combinational circuit;
- each master latch of each of said shift register stages, other than said first stage, of each of said shift register segment comprising, a tenth NAND circuit (24, FIG. 2) having an input connected to the output of the slave latch of its preceding shift register stage, a second input connected to said source of master clock pulses (80, FIG. 2) and an output, an eleventh NAND circuit (25, FIG. 2) having at least a first input connected to said source of data inputs (3, FIG. 2) and an additional input connected to said source of system clock pulses (84, FIG. 2) and an output, a twelfth NAND circuit (26, FIG. 2) having a first input connected to said source of inverted master clock pulses (81, FIG. 2), a second input connected to said source of inverted system clock pulses (85, FIG. 2) a third input and an output, a thirteenth NAND circuit (27, FIG. 2) having a first input connected to said output of said tenth NAND circuit, a second input connected to said output of said eleventh NAND circuit, a third input connected to said output of said twelfth NAND circuit and an output connected to said third input of said twelfth NAND circuit, said output of said thirteenth NAND circuit also providing the output (45, 4, FIG. 2) for said master latch; and
- each slave latch of each of said shift register stages, other than said first stage, of each of said shift register segments, comprising a fourteenth NAND circuit (28, FIG. 2) having a first input connected to said output (of said thirteenth NAND circuit) of its associated Master Latch, a second input connected to said source of slave clock pulses (82, FIG. 2), and an output, a fifteenth NAND circuit (29, FIG. 2) having a first input connected to said source of inverted slave clock pulses (83, FIG. 2), a second input and an output, a sixteenth NAND circuit (30, FIG. 2) having a first input connected to the output of said fourteenth NAND circuit, a second input connected to the output of said fifteenth NAND circuit and an output connected to the second input of said fifteenth NAND circuit, said output of said sixteenth NAND circuit also providing the output (48, 4, FIG. 2) for said slave latch.

5. In a readily testable electronic system for performing a useful function, as recited in claim 4, wherein:
- each of said test combinational circuits (5', FIG. 3) of each of said minimum replaceable units is connected only to a single input of said third NAND circuit (24, FIG. 3) of said master latch of said first stage of said shift register segment of the minimum replaceable unit of which said combinational circuit is a portion; and
- each of said test combinational circuits of each of said minimum replaceable units comprising a first INVERTER circuit (42, FIG. 3) having an input connected to a source of short test circuit pulses (8A, FIG. 3) and an output, a second INVERTER circuit (43, FIG. 3) having an input connected to a source of extended duration test circuit pulses (8B, FIG. 3) and an output, a first NAND circuit (44, FIG. 3) having a first input connected to said output of said second INVERTER circuit, a second input connected to a source of shift pulses (6, FIG. 3) and an output, a second NAND circuit (46, FIG. 3) having a first input connected to said output of said first INVERTER circuit, a second input connected to said output of said first NAND circuit and an output connected to the first input of NAND circuit (24, FIG. 3) of the Master Latch of the first stage of the shift register segment of the minimum replaceable unit with which said test combinational circuit is associated.

* * * * *